United States Patent [19]

Gill

[11] Patent Number: 5,238,855
[45] Date of Patent: Aug. 24, 1993

[54] CROSS-POINT CONTACT-FREE ARRAY WITH A HIGH-DENSITY FLOATING-GATE STRUCTURE

[75] Inventor: Manzur Gill, Rosharon, Tex.

[73] Assignee: Texas Instruments Incorporated, Dallas, Tex.

[21] Appl. No.: 722,729

[22] Filed: Jun. 27, 1991

Related U.S. Application Data

[60] Division of Ser. No. 403,065, Sep. 1, 1989, Pat. No. 5,051,796, which is a continuation of Ser. No. 269,837, Nov. 10, 1988, abandoned.

[51] Int. Cl.$^5$ .................. H01L 21/265; H01L 21/465
[52] U.S. Cl. ........................................ 437/43; 437/48
[58] Field of Search ............................ 437/43, 48, 52; 357/23.5, 23.6; 365/185

[56] References Cited

U.S. PATENT DOCUMENTS

| | | | |
|---|---|---|---|
| 4,151,537 | 4/1979 | Goldman et al. | 357/23 |
| 4,326,331 | 4/1982 | Guterman | 29/571 |
| 4,379,343 | 4/1983 | Moyer | 365/185 |
| 4,426,764 | 1/1984 | Kosa et al. | 437/43 |
| 4,434,433 | 2/1984 | Nishizawa | 357/22 |
| 4,455,568 | 6/1984 | Shiota | 357/54 |
| 4,471,373 | 9/1984 | Shimizu | 357/41 |
| 4,597,060 | 6/1986 | Mitchell et al. | 365/185 |
| 4,652,897 | 3/1987 | Okuyama et al. | 357/23.5 |
| 4,663,645 | 5/1987 | Komori et al. | 357/23.5 |
| 4,698,787 | 10/1987 | Mukherjee et al. | 365/185 |
| 4,698,900 | 10/1987 | Esquivel | 437/52 |
| 4,763,177 | 8/1988 | Paterson | 357/23.5 |
| 4,774,202 | 9/1988 | Pan et al. | 437/52 |
| 4,829,482 | 5/1989 | Owen | 365/185 |
| 4,839,705 | 6/1989 | Tigelaar et al. | 365/185 |
| 4,849,369 | 7/1989 | Jeuch et al. | 437/43 |
| 4,851,365 | 7/1989 | Jeuch | 437/43 |
| 4,855,800 | 8/1989 | Esquivel et al. | 357/23.5 |

FOREIGN PATENT DOCUMENTS

| | | | |
|---|---|---|---|
| 0282137 | 9/1988 | European Pat. Off. | 365/185 |
| 0284724 | 10/1988 | European Pat. Off. | 365/185 |
| 59-229872 | 12/1984 | Japan | 357/23.5 |
| 0186477 | 8/1988 | Japan | 437/52 |
| 1-37877 | 2/1989 | Japan | 365/185 |
| 1-76773 | 3/1989 | Japan | 365/185 |

OTHER PUBLICATIONS

S. M. Sze, "VLSI Technology", Second Edition, 1983, McGraw-Hill Book Company, New York, pp. 266–267 and 493–495.

*Primary Examiner*—Olik Chaudhuri
*Assistant Examiner*—Loc Q. Trinh
*Attorney, Agent, or Firm*—Theodore D. Lindgren; Leo N. Heiting; Richard L. Donaldson

[57] ABSTRACT

A contact-free floating-gate non-volatile memory cell array and process with silicided NSAG bitlines and with source/drain regions buried beneath relatively thick silicon oxide. The bitlines have a relatively small resistance, eliminating the need for parallel metallic conductors with numerous bitline contacts. The array has relatively small bitline capacitance and may be constructed having relatively small dimensions. Bitline isolation is by P/N junction or by oxide-filled trench, permitting relatively small spacing between transistors. Wordlines may be formed from silicided polycrystalline or other material with low resistivity. Coupling of programming and erasing voltages to the floating gate is improved by using an insulator with relatively high dielectric constant between the control gate and the floating gate. The resulting structure is a dense crosspoint array of programmable memory cells.

21 Claims, 5 Drawing Sheets

CROSS-POINT CONTACT-FREE ARRAY WITH A HIGH-DENSITY FLOATING-GATE STRUCTURE

This is a division of application Ser. No. 07/403,065, filed Sep. 1, 1989, now U.S. Pat. No. 5,061,796 which is a continuation of application Ser. No. 07/269,837, filed Nov. 10, 1988, now abandoned.

RELATED PATENT APPLICATIONS

This application discloses subject matter also disclosed in co-pending U.S. patent application Ser. Nos. 07/269,838, 07/269,899, 07/269,386, 07/270,594, all of which are hereby incorporated herein and filed herewith and all of which are also assigned to Texas Instruments Incorporated.

BACKGROUND OF THE INVENTION

This invention relates to integrated-circuit erasable-programmable-read-only-memory (EPROM) arrays and to electrically-erasable-programmable-read-only-memory (EEPROM) arrays and, in particular, to EPROM and EEPROM structures having buried bitlines that include source-drain regions.

Floating-gate, avalanche-injection, metal-oxide-semiconductor (FAMOS) structures having buried, diffused bitlines that include source-drain regions are described in U.S. Pat. No. 4,373,248 issued Feb. 15, 1983 to David J. McElroy and in U.S. patent application Ser. No. 128,549 filed Dec. 3, 1987 both assigned to Texas Instruments Incorporated. Such structures have several advantages over other structures, including smaller memory-cell area, reduced number of contacts, and planar array topography. On the other hand, the described structures have disadvantages, including an interdependent relationship between N+ junction depth and the thickness of the isolation oxide over the buried bitlines, high bitline junction capacitance, high drain-to-floating-gate capacitance and non-silicided bitlines. In addition, the described structures cannot be linearly shrunk without decreasing the coupling ratio of the control-gate voltage to the floating-gate voltage during programming and/or erasing.

The capacitance of prior-art buried N+ bitlines is high because of the required deeply buried N+ junction that assures adequate grown oxide thickness above the buried N+, because of the required relatively wide bitlines that ensure adequate coupling between polycrystalline silicon (polysilicon) layers, and because of the junction capacitance in the bitline isolation region. See, for example, J. Esquivel, et al.; IEDM Tech. Digest Papers, 592 (1986).

Prior-art buried N+ FAMOS devices have high drain-to-floating-gate capacitive coupling, leading to a small margin between the device drain-coupled turn-on voltage and the device breakdown voltage during programming. As a result, a part of the programming current may flow through non-selected bits sharing a bitline with the selected bit, causing reduced threshold voltage shift in the programmed bits.

The buried bitlines of prior-art devices generally cannot be silicided because, the buried N+ junctions and the oxide insulating regions over those junctions are formed early in the process, before formation of the gate oxide, the floating gate, the control or programming gate and other field-effect devices. Some of the later-occurring steps in the process for forming those elements require temperatures higher than 900° Celsius, and processes at temperatures that high are not desirable after siliciding of the buried N+bitlines. Without siliciding, the bitlines have a high resistance that requires space-consuming connections with parallel metal conductors at intervals of every few transistor cells. A prior-art silicided buried bitline process and structure is described in U.S. Pat. No. 4,597,060 issued Jun. 24, 1986 to Allan T. Mitchell et al. and assigned to Texas Instruments Incorporated. The process and structure of that invention requires formation of the silicided bitline prior to formation of the inter-level dielectric layer and the combined control gates/wordlines.

Accordingly, there is a need for an integrated-circuit structure and a procedure for fabricating that structure such that bitline and drain-to-floating-gate capacitances are decreased, such that the N+junction depth/profile can be optimized independent of oxide thickness above the bitlines, and such that the coupling ratio of the control-gate voltage to the floating-gate voltage does not decrease as the memory cell dimensions are downsized. In addition, there is a need for bitlines that are silicided to allow elimination of presently used metal interconnect conductors above and parallel to buried bitlines.

SUMMARY OF THE INVENTION

The buried-bitline structure of this invention decreases bitline and drain-to-floating-gate capacitances and permits downsizing of memory-cell dimensions. The bitline capacitance is reduced through use of NSAG (N+ Self-Aligned Gate) bitlines that are buried under wordlines. Reduced total lateral diffusion of the NSAG bitlines decreases the capacitance between the drain and the floating-gate. The process permits the bitlines to be silicided to lower the bitline resistance and therefore to decrease the number of contacts necessary, eliminating the need for parallel interconnect conductors. The N+ junction depth/profile is independent of the thickness of the oxide above the buried bitlines. Bitline isolation is by P/N junction or by trench isolation, rather than by thick oxide as in co-pending U.S. patent application Ser. Nos. 07/269,838, 07/269,749, 07/269,836, 07/270,594, all of which are also assigned to Texas Instruments Incorporated. Bitline isolation by trench isolation is disclosed in U.S. Pat. No. 4,698,900, also assigned to Texas Instruments Incorporated. The area required for each cell is less than that required by prior-art cells. In addition, coupling ratio of the control-gate-to-floating-gate capacitance and the floating-gate-to-substrate capacitance is a function of the dielectric properties and thickness of the insulating layers between those elements.

BRIEF DESCRIPTION OF THE DRAWINGS

The novel features of this invention are set forth in the appended claims. The invention, its features, and its advantages are described below in conjunction with the following drawings:

DETAILED DESCRIPTION OF THE SPECIFIC EMBODIMENT

Figure 1A:
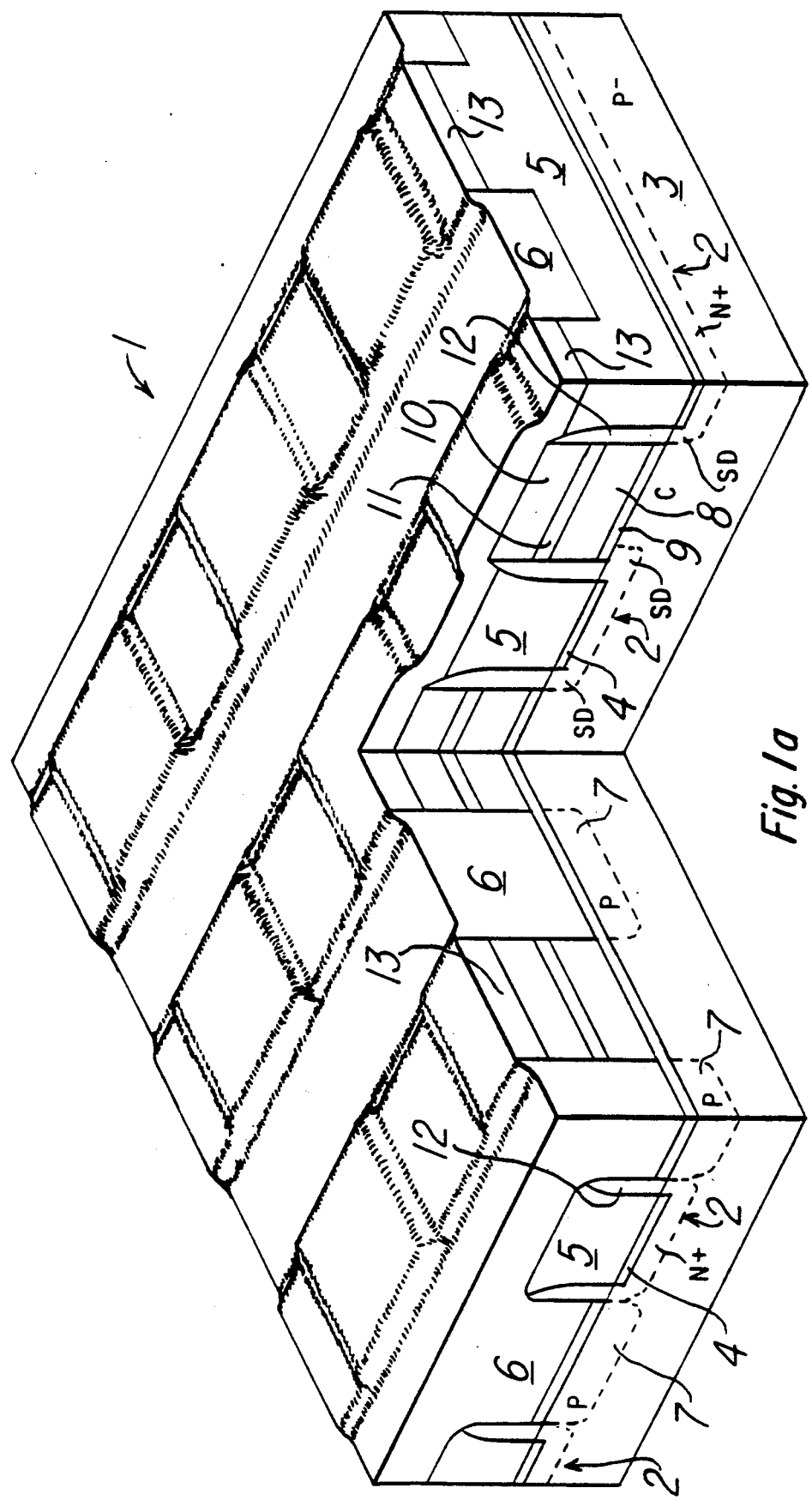
FIGS. 1a and 1b represent isometric views, in section, of parts of cross-point FAMOS array embodiments of this invention. The two center sections of each Figure represent elevation views drawn through the gates of the transistors of the embodiments. The two outside sections represent elevation views drawn through regions between those gates.
Figure 1B:
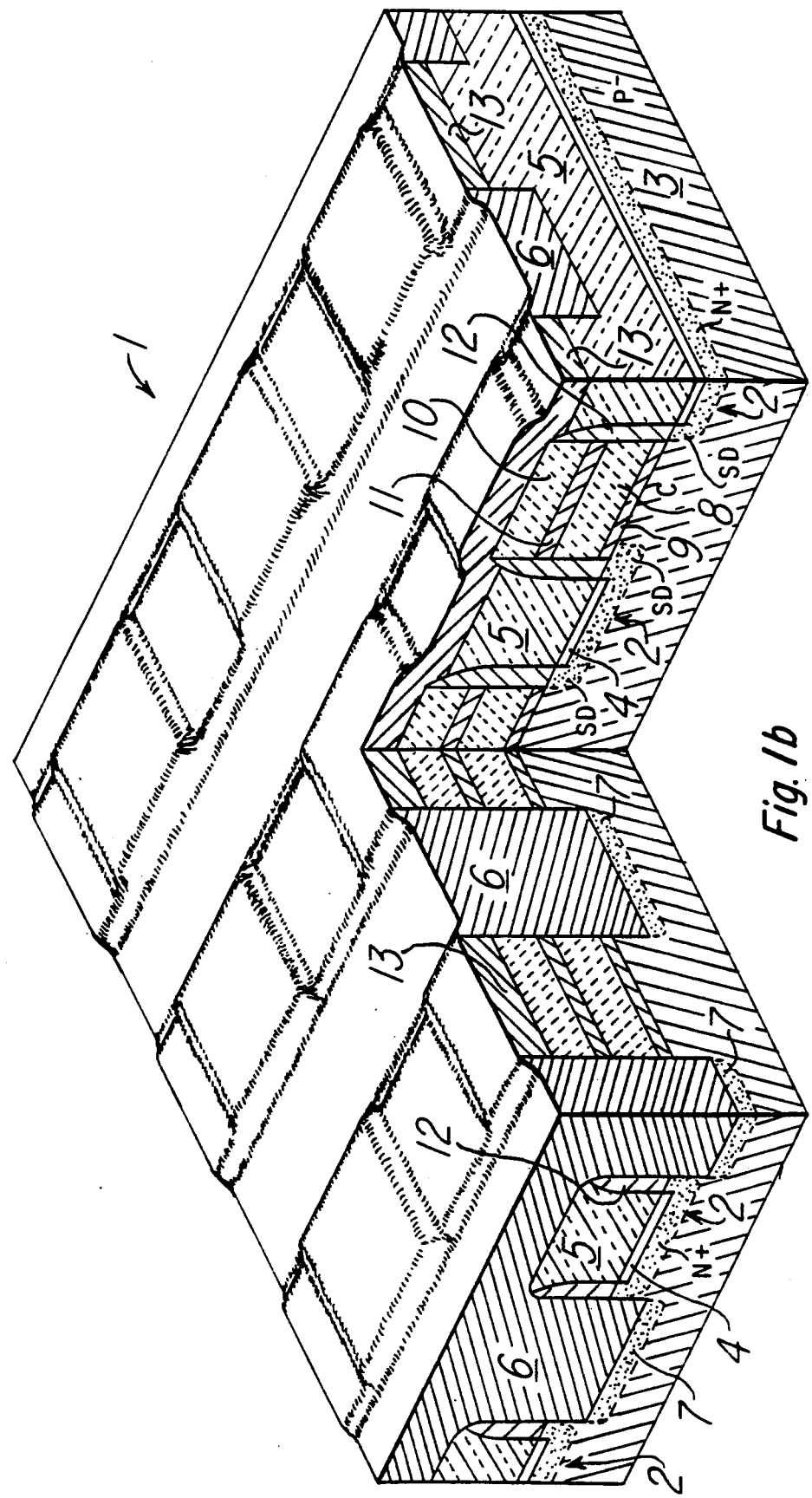
Figure 2:
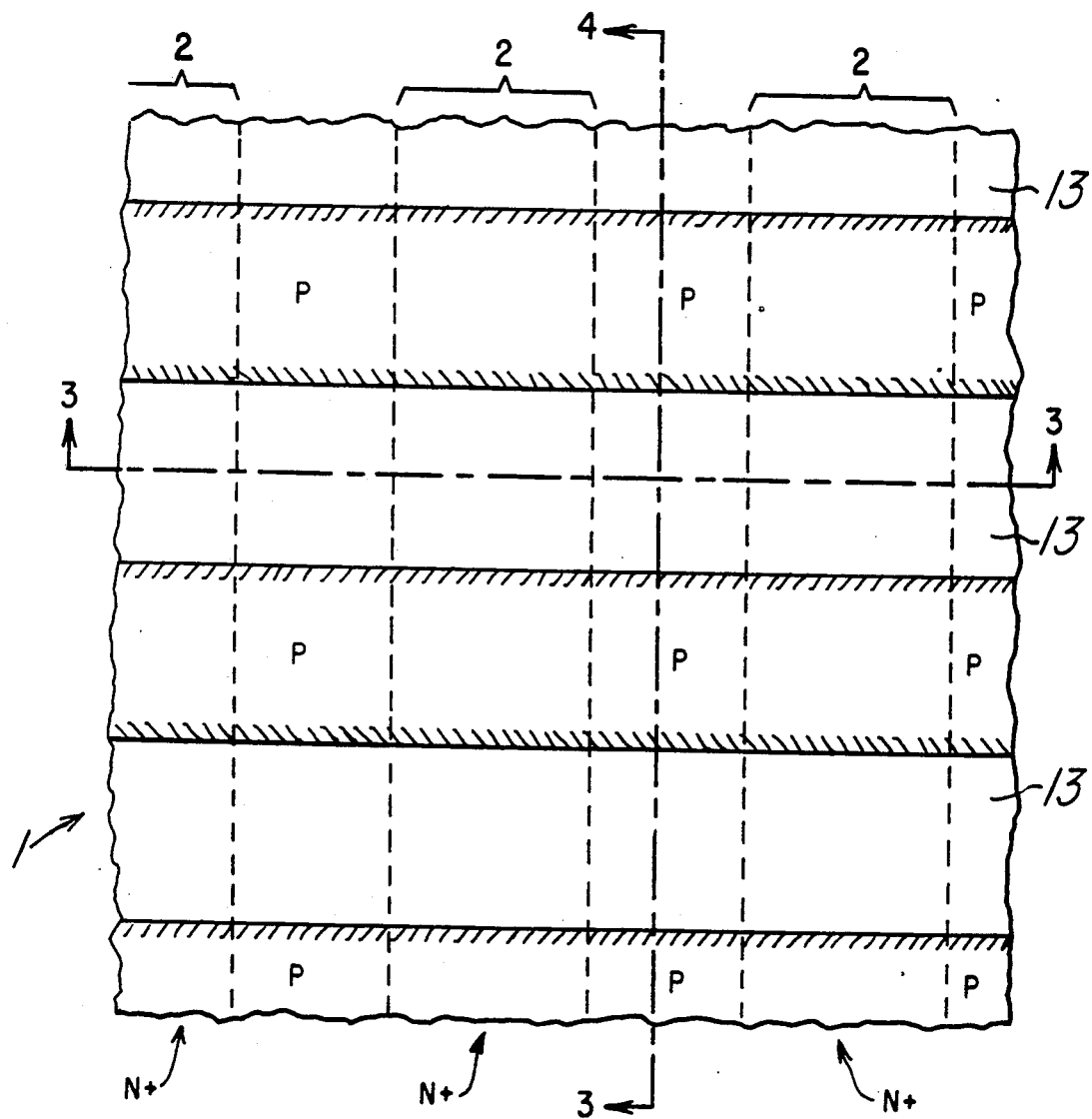
FIG. 2 represents a top view of the device of this invention.
Figure 3A:
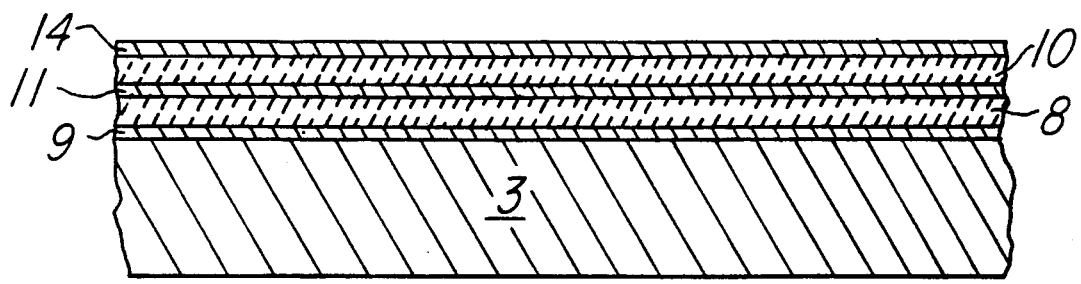
FIGS. 3a–3d represent, in section as indicated, elevation views of the device of FIG. 2 and of the right inner sections of FIGS. 1a and 1b at various stages of fabrication.
Figure 3B:
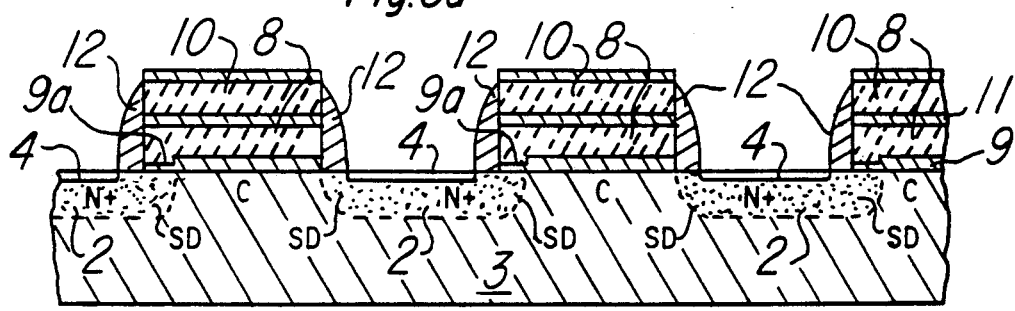
Figure 3C:
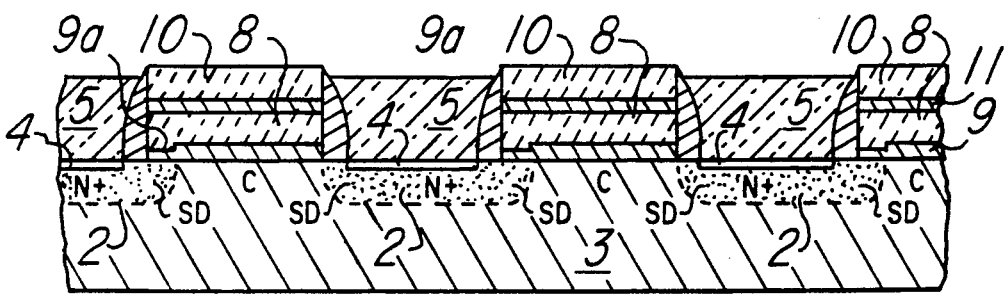
Figure 3D:
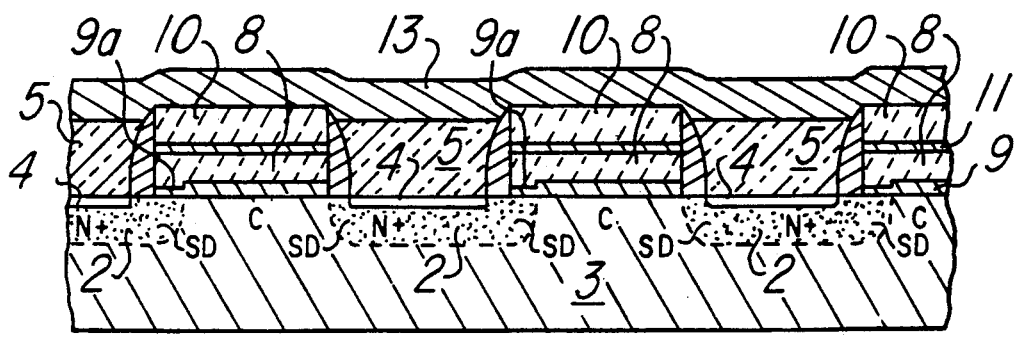

Referring to FIG. 1, for example, FAMOS transistors 1 include a plurality of buried conductors 2 in the face of semiconductor substrate 3. Buried conductors 2 are formed using a NSAG process and include silicided upper-surface regions 4. The conductors 2 are heavily doped regions buried under relatively thick first insulating oxide strips 5, and are continuous through the array of FAMOS transistors. Alternate buried conductors 2 are bitlines. Buried conductors 2 are isolated from each other in part by second insulating oxide strips 6, which are illustrated in FIGS. 1a–b as oxide-filled, stack-etched regions over P-type doped isolation regions 7 and over first insulating oxide strips 5. Conductors 2 include N+ doped source-drain regions SD adjacent each channel region C. Each polysilicon floating gate 8 is separated from a channel region C by gate oxide layer 9 and from a control gate section 10 by an inter-level dielectric layer 11. For use in EEPROM applications and as illustrated in FIGS. 3b–3d, gate oxide layer 9 may have a thin tunnelling region 9a for erasing. Tunnelling region 9a may have a thickness of perhaps 100 Angstroms, as compared to 350–400 Angstroms for the remainder of gate oxide layer 9. Silicided bitlines 2 include N+ doped source-drain regions SD. Sidewall oxide spacers 12 may be used to separate silicided regions 4 from floating gate 8 and are located adjacent the sides of each floating gate 8 and of each control gate 10 above each source-drain region SD. Wordlines 13, which may be silicided polysilicon or refractory metal, connect control gates 10 to complete the cross-point array. Wordlines 13 are substantially at right angles with respect to conductors 2.

The material for and dimensions of inter-level dielectric layer 11 and gate oxide layer 9 are chosen to provide adequate coupling to the floating gate of programming signals applied at control gate 10. As is wellknown, the capacitance between control gate 10 and floating gate 8 should ideally be much greater than the capacitance between floating gate 8 and other nodes for appropriate coupling of the programming voltage to produce either tunnelling of electrons between the substrate 3 and floating gate 8 in EEPROM applications or avalanche injection to the floating gate 8 in EPROM applications. And as in all floating-gate non-volatile memory devices, those capacitances vary according to relative sizes of gate surfaces and channel surfaces, according to dielectric types, and according to dielectric thicknesses.

It is desirable for memory-cell arrays to have a very low bitline capacitance because a small bitline capacitance improves speed of operation. In prior-art buried conductor cells the bitline capacitance is determined by the depth and area of the depletion region formed by the reverse-biased diode junction of what would correspond to the N+ conductor 2 and the P-doped substrate 3 of this invention. The bitline capacitance of the device of this invention is less than that of prior-art memory cell structures because the area of N+/P junction is reduced by narrowing bitline 2 and by reducing the N+/P junction depth. In addition, the bitline capacitance is less than that of prior-art memory arrays because the bitlines are shorter as a result of elimination of additional distance required for contacts with parallel conductors.

In FIG. 1a, the stack-etched oxide-filled insulating strip 6 does not extend downward into substrate 3. In FIG. 1b the trench-etched oxide-filled insulating strip 6 extends downward into substrate 3.

In general, the thickness of inter-level dielectric layer 11 should be less than that of gate oxide layer 9 and the dielectric constant of inter-level dielectric layer 11 should be greater than that of gate oxide layer 9.

Figure 4A:
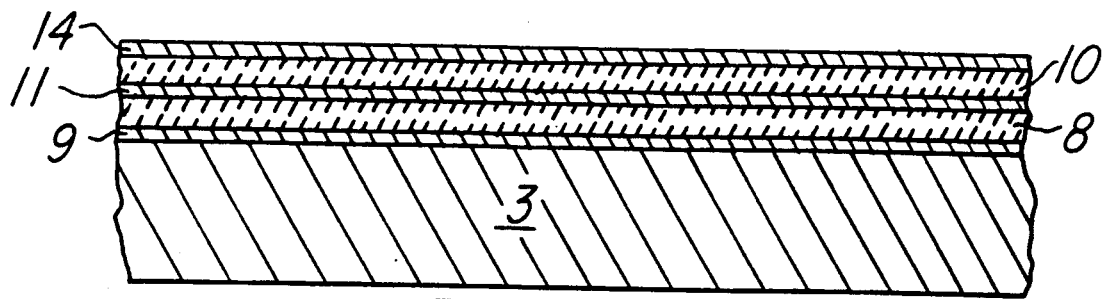
FIGS. 4a–4d represent, in section as indicated, elevation views of the device of FIG. 2 and of the left inner section of FIG. 1a at various stages of fabrication.

A method of making the device of FIGS. 1a–b will be described in reference to FIGS. 3a–3d and 4a–4d. The starting material is a slice of P-type silicon, of which the semiconductor substrate 3 is only a very small portion. The slice is perhaps six inches in diameter, while the portion shown in FIGS. 1a–b is only a few microns wide. A number of process steps would be performed to create transistors peripheral to the array, and these steps are not discussed herein. For example, the memory device would typically be of the field-effect type having N-wells and P-wells formed in the substrate. Those N-wells and P-wells may require a voltage-threshold adjustment process, as is wellknown. As indicated in FIGS. 3a and 4a, the first step related to the cell array of the invention is forming a gate oxide layer 9 approximately 350 Angstroms thick by exposing the face of substrate 3 to oxygen and gaseous hydrochloric acid at ambient pressure and at a temperature of approximately 950° Celsius for about 50 minutes, using conventional gate oxidation procedure. Tunnelling region 9a may be formed by patterning and etching gate oxide layer 9, re-growing oxide if necessary.

Next, first conductive or polysilicon floating gate 8 layer is applied to the surface, as also indicated in FIGS. 3a and 4a. The first conductive or floating gate 8 layer may be about 3000 Angstroms thick and is doped N+.

Referring again to FIGS. 3a and 4a, inter-level dielectric layer 11 is then formed of silicon oxide, or of oxide-nitride-oxide, or of aluminum oxide, or of aluminum nitride, or of tantalum pentaoxide, for example, according to well-known procedures. The dielectric constant of inter-level dielectric layer 11 should be as large as possible and its thickness should be small as possible, consistent with EPROM and EEPROM requirements for wordline-to-floating gate capacitive coupling ratio, for dielectric breakdown voltage, and for dielectric charge leakage criteria.

Next, second conductive or polysilicon control gate 10 layer is applied to the surface using conventional procedures, as also indicated in FIGS. 3a and 4a. Second conductive or control gate 10 layer may also be approximately 3000 Angstroms thick and is doped N+.

A protective layer 14 of oxide, or of oxide-nitride, is then deposited over the surface using well-known methods, as illustrated in FIGS. 3a and 4a.

Figure 4B:
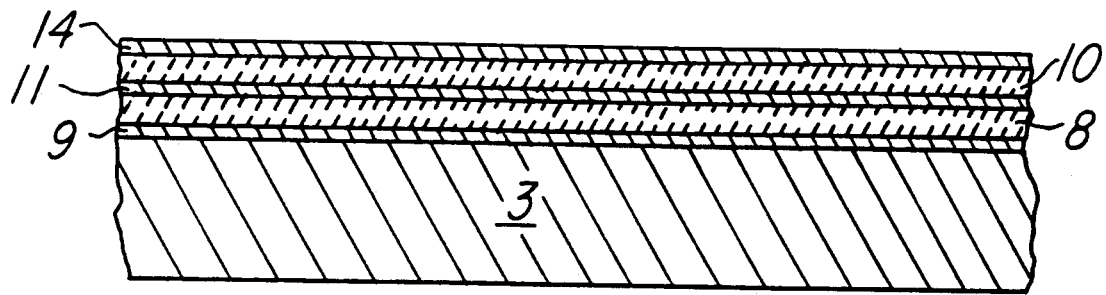
Figure 4C:
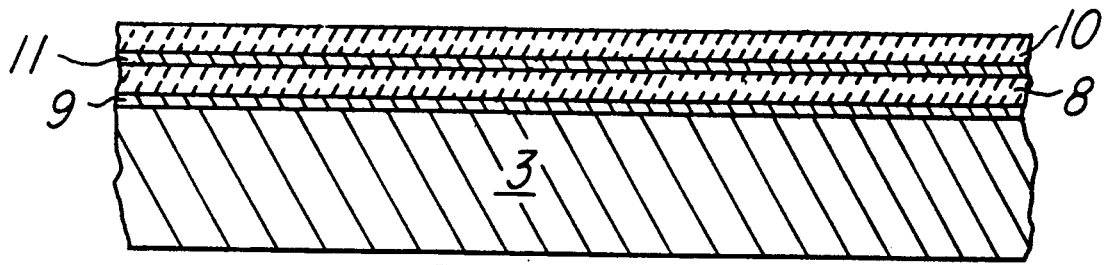

Referring now to FIGS. 3b and 4b, strips that will become control gates 10 and floating gates 8 are formed by patterning the surface of protective layer 14 and stack-etching through protective layer 14, control gate 10 layer, inter-level dielectric layer 11 and floating gate 8 layer. An oxide may then be grown on the sides of the strips that will become control gates 10 and floating gates 8 for the purpose of improving data retention in floating gates 8.

As illustrated in FIG. 3b, conductors 2 are then formed by implanting with arsenic to create an abrupt junction on the programming side and by double implantation of both arsenic and phosphorus to create a graded junction on the read side, indicated as N+ source-drain regions SD in the surface of substrate 3. The implantation is followed by a standard implant anneal at appropriate temperature. The arsenic/phosphorus implant provides a graded junction that avoids read disturb caused by hot electron effect and that suppresses write disturb during programming.

As also illustrated in FIG. 3b, sidewall oxide regions 12 may then be formed on the sides of the strips that will become control gates 10 and floating gates 8 using well-known procedures, such as those described in U.S. Pat. No. 4,566,175, issued Jan. 28, 1986 and assigned to Texas Instruments Incorporated.

Alternatively, a lightly doped (commonly referred to as LDD) junction profile may be formed on the read side to avoid read/write disturb by performing the arsenic/phosphorus implant and the annealing step after sidewall oxide regions 12 are formed, as also described in U.S. Pat. No. 4,566,175 referenced above. Whether the junction is lightly doped or doubly diffused, it should completely underlay tunnelling region 9a to avoid read disturb.

The conductors 2 are then silicided in accordance with wellknown procedures to form silicide regions 4. One such procedure is described in U.S. Pat. No. 4,672,419, issued Jun. 9, 1987 and assigned to Texas Instruments Incorporated. It is desirable to select subsequent processes that do not require temperatures exceeding 900° Celsius to prevent dopant diffusion from the junction to the silicided region, and to avoid junction spiking.

Referring now to FIG. 3c, the structure is then made planar by using a procedure that requires a temperature of 900° Celsius or less. One such procedure is the deposition of a thick oxide over the structure and the use of a resist etch-back process to remove the higher elevations of that oxide. The etch removes protective layer 14 from the upper surfaces of strips that will become control gates 10 and floating gates 8. As a result of this step, bitlines 2 are buried under first insulating oxide strips 5.

Figure 4D:
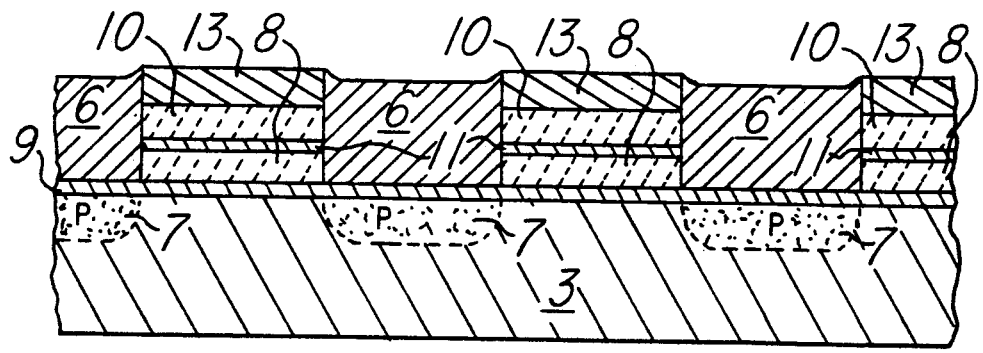

Referring now to FIGS. 3d and 4d, a third conductive or wordline 13 polysilicon layer is formed on the surface of the structure and is doped N+. Third conductive or polysilicon wordline 13 layer may be silicided for increased conductivity. Wordline layer 13 may also be formed from layered refractory metal and polysilicon. In the alternative, wordline 13 layer may be formed from a refractory metal such as tungsten, or from a refractory metal silicide such as tungsten silicide or titanium silicide. Wordlines 13 are patterned and stack etching is conducted through wordline 13 layer, control gate 10 strips, inter-level dielectric layers 11 and floating gate 8 strips to form wordlines 13, control gates 10 and floating gates 8, as illustrated in FIGS. 1a, 3d and 4d. In the alternative, etching may extend through the stack to form a trench in the substrate, as illustrated in FIG. 1b. The generally practiced plasma etch technique chosen for this step should etch polysilicon faster than oxide in order that a relatively small part of first oxide insulating strips 5 and sidewall oxide regions 12 will be removed. Again, an oxide coating may be formed on the sides of control gates 10 and floating gates 8 to improve data retention in floating gates 8. The surface is then exposed to a channel-stop boron implantation of perhaps $1 \times 10^{12}$ cm$^{-2}$ at 50 KeV for forming P-type isolation regions 7 between bitlines 2 and wordlines 13, as illustrated in FIG. 4d. Also as illustrated in FIG. 4d, the structure may again be made planar by depositing an oxide and using a resist etch-back procedure similar to that used previously, thereby forming second insulating oxide strips 6.

The upper surface may then be covered with a final layer of oxide, again made planar, and etched at appropriate locations to provide contact with metal conductors, which are formed by depositing a metal layer, then patterning and etching that metal layer.

While this invention has been described with respect to an illustrative embodiment, this description is not intended to be construed in a limiting sense. Upon reference to this description, various modifications of the illustrative embodiment, as well as other embodiments of the invention, will be apparent to persons skilled in the art. It is contemplated that the appended claims will cover any such modifications or embodiments that fall within the scope of the invention.

I claim:

1. A method for making a non-volatile memory cell array including bitlines and wordlines in a face of a semiconductor substrate of first conductivity type, said bitlines extending in a first direction and said wordlines extending in a second direction generally perpendicular to said first direction, comprising the steps of:

growing a gate oxide layer on said face;

applying a first conductive layer on said face;

applying a second conductive layer on said face overlying and insulated from said first conductive layer by an inter-level dielectric layer;

forming a protective layer over said second conductive layer;

patterning said protective layer and etching said protective layer, said second conductive layer, said inter-level dielectric layer, said first conductive layer, and said gate oxide layer to form control-gate strips and floating-gate strips extending in said first direction;

implanting an impurity material of second conductivity type to form conductors parallel to and adjacent to said strips;

siliciding said conductors;

forming first insulating oxide strips in the spaces between said control-gate and floating-gate strips and over said conductors;

removing a part of said first insulating oxide strips and substantially all of said protective layer to form a surface substantially planar including the upper surface of said second conductive layer;

applying a third conductive layer to said substantially planar surface;

patterning said third conductive layer and etching said third conductive layer and said control-gate and floating-gate strips to form wordlines from said third conductive layer, an individual control gate for each memory cell from said control-gate strips and an individual floating gate for each memory cell from said floating-gate strips while leaving said conductors protected by said insulating oxide;

implanting an impurity material of said first conductivity type in regions between said conductors and between said wordlines; and forming second insulating oxide strips between said wordlines and over portions of said first insulating oxide strips and over said implanted impurity regions between said conductors and between said wordlines.

2. A method according to claim 1 wherein said first impurity-type is P-type and said second impurity-type is N-type.

3. A method according to claim 1 wherein said first and second layers are polycrystalline silicon.

4. A method according to claim 1 wherein sidewall oxide spacers are formed adjacent said control-gate strips and said floating-gate strips after said implanting of an impurity material of second conductivity type.

5. A method according to claim 1 wherein sidewall oxide spacers are formed adjacent said control-gate strips and said floating-gate strips before said implanting of an impurity material of second conductivity type.

6. A method according to claim 1 wherein the capacitance associated with said gate oxide layer is less than the capacitance associated with said inter-level dielectric layer.

7. A method according to claim 1 wherein said inter-level dielectric layer includes silicon oxide.

8. A method according to claim 1 wherein said inter-level dielectric layer includes oxide-nitride-oxide.

9. A method according to claim 1 wherein said inter-level dielectric layer includes aluminum oxide.

10. A method according to claim 1 wherein said inter-level dielectric layer includes aluminum nitride.

11. A method according to claim 1 wherein said inter-level dielectric layer includes tantalum pentaoxide.

12. A method according to claim 1 wherein two impurities are implanted to form graded junctions in at least alternating ones of said conductors.

13. A method according to claim 1 wherein two impurities are implanted to form graded junctions in at least alternating ones of said conductors, wherein said implantation is made after formation of sidewall oxide spacers adjacent said control-gate strips and said floating-gate strips.

14. A method according to claim 1 wherein said third conductive layer is polycrystalline silicon.

15. A method according to claim 1 wherein said third conductive layer is silicided polycrystalline silicon.

16. A method according to claim 1 wherein said third conductive layer is refractory metal.

17. A method according to claim 1 wherein said third conductive layer is layered refractory metal and polysilicon.

18. A method according to claim 1 wherein said impurity material implanted in the region between said conductors and between said wordlines is boron.

19. A method according to claim 1 including a step for growing oxide on the sides of said floating gates for the purpose of improved data retention.

20. A method according to claim 1 in which said step of patterning said protective layer and etching said protective layer, said second conductive layer, said inter-level dielectric layer, said first conductive layer, and said gate oxide layer includes etching trenches in said substrate between said wordlines.

21. A method for making a non-volatile memory cell array including bitlines and wordlines in a face of a semiconductor substrate of first conductivity type, said bitlines extending in a first direction and said wordlines extending in a second direction generally perpendicular to said first direction, comprising the steps of:

growing a gate oxide layer on said face;

applying a first conductive layer on said face;

applying a second conductive layer on said face overlying and insulated from said first conductive layer by an inter-level dielectric layer;

forming a protective layer over said second conductive layer;

patterning said protective layer and etching said protective layer, said second conductive layer, said inter-level dielectric layer, said first conductive layer, and said gate oxide layer to form control-gate strips and floating-gate strips extending in said first direction;

implanting an impurity material of second conductivity type to form conductors parallel to and adjacent to said strips;

siliciding said conductors;

forming first insulating oxide strips in the spaces between said control-gate and floating-gate strips and over said conductors;

removing a part of said first insulating oxide strips and substantially all of said protective layer to form a surface substantially planar including the upper surface of said second conductive layer;

applying a third conductive layer to said substantially planar surface, wherein said third conductive layer is layer refractory metal and polysilicon;

patterning said third conductive layer and etching said third conductive layer and said control-gate and floating-gate strips to form wordlines from said third conductive layer, an individual control gate for each memory cell from said control-gate strips and an individual floating gate for each memory cell from said floating-gate strips while leaving said conductors protected by said insulating oxide; and implanting an impurity material of said first conductivity type in regions between said conductors and between said wordlines.

* * * * *